United States Patent [19]
Wang et al.

[11] Patent Number: 5,547,881
[45] Date of Patent: Aug. 20, 1996

[54] METHOD OF FORMING A RESISTOR FOR ESD PROTECTION IN A SELF ALIGNED SILICIDE PROCESS

[75] Inventors: Jau-Jey Wang; Pi-Chen Shieh; Pin-Nan Tseng, all of Hsin-Chu, Taiwan

[73] Assignee: Taiwan Semiconductor Manufacturing Company LTD, Hsin-Chu, Taiwan

[21] Appl. No.: 612,620

[22] Filed: Mar. 6, 1996

[51] Int. Cl.$^6$ ................................................ H01L 21/266
[52] U.S. Cl. .......................... 437/24; 437/200; 437/918
[58] Field of Search .................................. 437/24, 44, 60, 437/200, 201, 918, 959

[56] References Cited

U.S. PATENT DOCUMENTS

| | | | |
|---|---|---|---|
| 4,370,798 | 2/1983 | Lien et al. | 437/918 |
| 4,859,278 | 8/1989 | Choi | 437/200 |
| 4,959,329 | 9/1990 | Okamoto et al. | 437/24 |
| 5,508,212 | 4/1996 | Wang et al. | 437/24 |

OTHER PUBLICATIONS

VLSI Technology–2nd Edition by S. M. Sze, McGraw Hill Book Co., Singapore, 1988, pp. 368–369.
"Silicon Processing For The VLSI Era–Vol. 1" Lattice Press, Sunset Beach, CA, 1986, pp. 390–391.

Primary Examiner—Chandra Chaudhari
Attorney, Agent, or Firm—George O. Saile; Larry J. Prescott

[57] ABSTRACT

A method is described for forming a high contact resistance region within the drain region or source region of an insulated gate field effect transistor as part of a high resistance resistor for electrostatic discharge protection of the field effect transistor. The high resistance contact region is formed as part of a self aligned silicide, or salicide, contact process. Nitrogen ion implantation at the high resistance contact region into the metal which will be used to form the metal silicide low resistance contacts converts the metal at the high resistance contact region to metal nitride. Since all the metal at the high resistance contact region is converted to metal nitride there is no free metal to form metal silicide at the high resistance contact region when the low resistance metal silicide contacts are formed. Low resistance contacts to the gate electrode, source, and drain are formed using metal silicide.

14 Claims, 5 Drawing Sheets

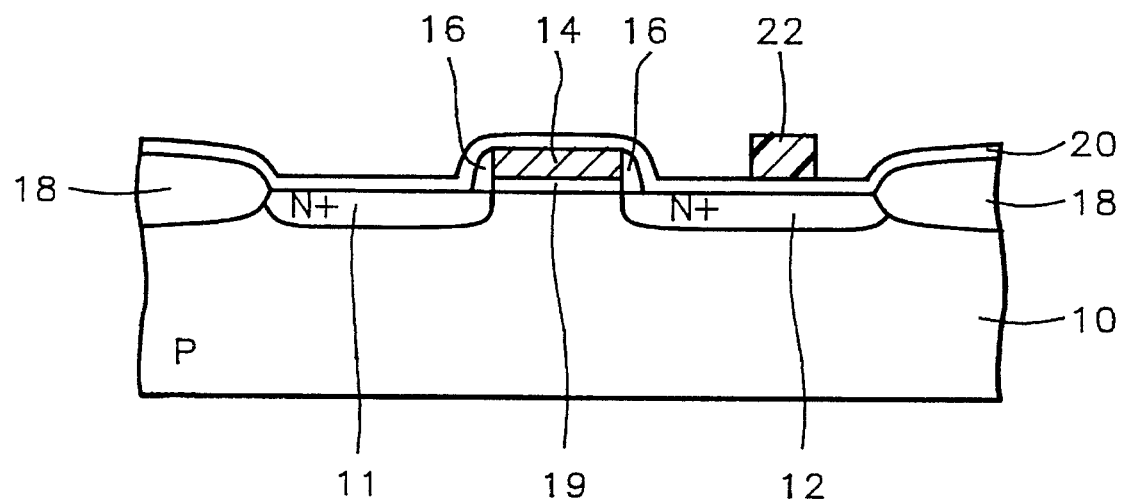
*FIG. 1 - Prior Art*
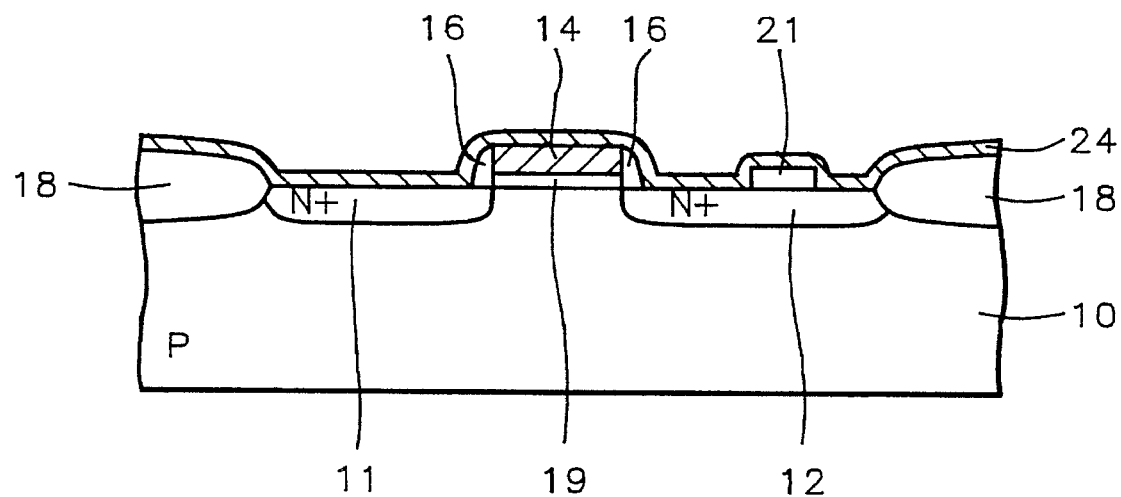
*FIG. 2 - Prior Art*

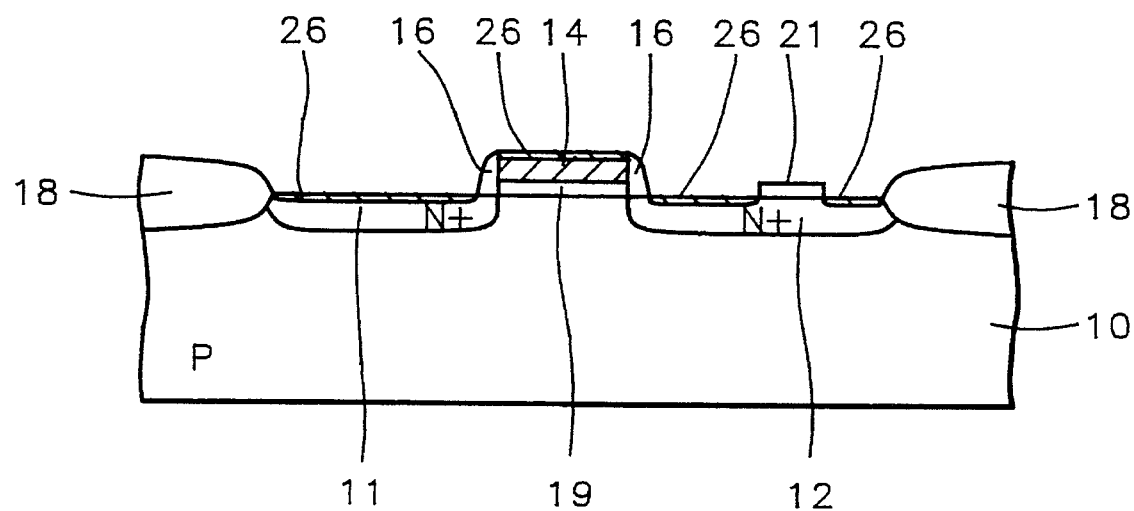
FIG. 3 - Prior Art
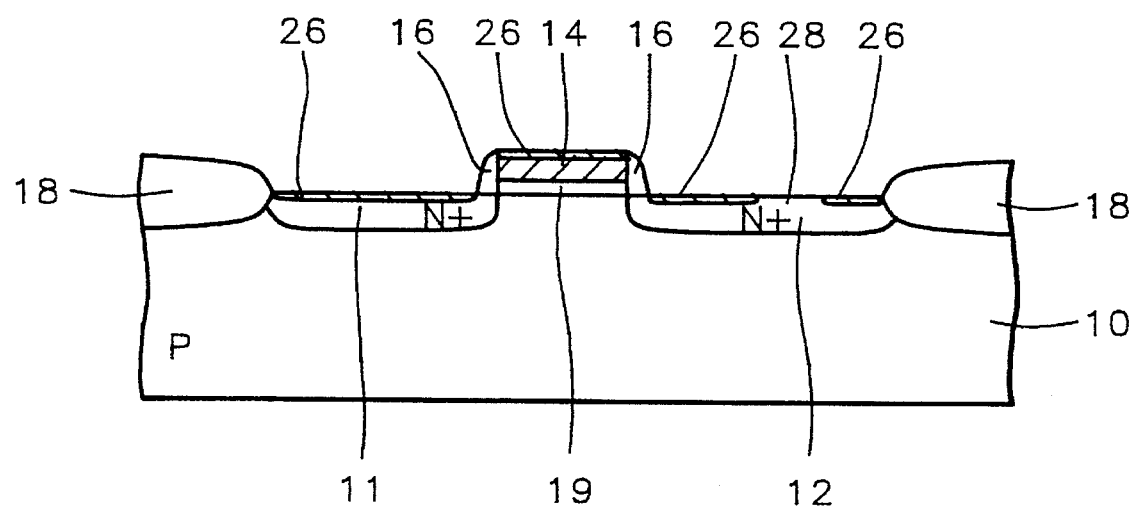
FIG. 4 - Prior Art

METHOD OF FORMING A RESISTOR FOR ESD PROTECTION IN A SELF ALIGNED SILICIDE PROCESS

RELATED PATENT APPLICATION (TSMC-95-201), Ser. No. 08/618,177, filed Mar. 19, 1996, entitled AN ION IMPLANT SILICON NITRIDE MASK FOR AN ESD PROTECTION RESISTOR IN A SELF ALIGNED SILICIDE PROCESS, assigned to the same assignee.

BACKGROUND OF THE INVENTION

1. Field of the Invention

The invention relates to the formation of a high resistance resistor for electrostatic discharge protection of insulated gate field effect transistors and more specifically to the formation of a high resistance contacts to the source or drain regions of insulated gate field effect transistors using self aligned silicide contacts.

2. Description of the Related Art

One important method of protection from damage due to electrostatic discharge, or ESD, in insulated gate field effect transistors is to use high resistance resistors to prevent high currents due to ESD. The formation of these high resistance resistors requires a high resistance contact to either the source or drain regions of the field effect transistors. There are process problems which must be overcome in the formation of these high resistance contacts when the low resistance contacts are formed using self aligned silicide methods. In the method taught by this invention titanium at the region where the high resistance contact is to be formed is converted to titanium nitride, using nitrogen ion implantation, and will not form titanium silicide during annealing since the free titanium has been consumed.

In the book VLSI TECHNOLOGY—Second Edition, by S. M. Sze, McGraw Hill Book Co., Singapore, 1988, pages 368-369 ion implantation of nitrogen into silicon is described but not ion implantation of nitrogen into titanium.

In the book SILICON PROCESSING FOR THE VLSI ERA, VOL. 1, Lattice Press, Sunset Beach, Calif., 1986, pages 390-391 there is a discussion of the metallurgical reaction to form refractory metal silicides, but not the use of nitrogen ions to form titanium nitride.

SUMMARY OF THE INVENTION

Damage from electrostatic discharge, ESD, to insulated gate field effect transistors has long been a problem. In using these devices in integrated circuits, electrostatic voltages large enough to damage gate oxides can easily be generated by human operator or mechanical handling of integrated circuits.

In order to protect insulated gate field effect transistors from damage due to ESD, methods have been devised to prevent the electrostatic voltages from building up to levels which can damage the transistors. In one such method a high resistance resistor is introduced to prevent sensitive device elements from the high, even though of very short duration, currents of electrostatic discharge. One method of providing such a high resistance resistor is by means of a high resistance contact to the source or drain region of a insulated gate field effect transistor.

FIGS. 1–4 show a conventional method for forming a high resistance contact to the source or drain of a metal oxide semiconductor field effect transistor. FIG. 1 shows a semiconductor substrate 10 having a source region 11, drain region 12, field oxide isolation regions 18, gate oxide 19, a polysilicon gate electrode 14 having sidewalls, and oxide spacers 16 formed on the sidewalls of the gate electrode. An oxide layer 20 is then formed on the silicon substrate covering the source 11, drain 12, gate electrode 14, and oxide spacers 16. A photoresist pattern 22 is then formed over the oxide layer 20 directly over the region where the high resistance contact will be formed.

As shown in FIG. 2, the oxide layer is then etched away leaving an oxide pattern 21 only over the region where the high resistance contact will be formed. A titanium layer 24 is then deposited over the silicon substrate and annealed thereby forming titanium silicide 26 over the gate electrode 14, the source region 11, and that part of the drain region 12 not covered by the oxide pattern 21. As shown in FIG. 3, that part of the titanium layer which has not been converted to titanium silicide is then etched away. Finally, as shown in FIG. 4, the oxide pattern is etched away and a high resistance contact region 28, having no titanium silicide, is formed in the drain region. The titanium silicide 26 forms low resistance contact regions at the gate electrode 14, the source region 11, and the drain region 12. This example has shown the high resistance contact region formed at the drain region, however the source and drain regions are interchangeable and the example could have shown the high contact resistance region in the source region.

A serious limitation of the conventional method of forming a high resistance contact region just described comes from the requirement to etch away the oxide layer 20 in order to form the oxide pattern 21 over the region where the high resistance contact will be formed, see FIGS. 1 and 3. In etching the oxide layer 20, see FIG. 1, part of the oxide spacer 16 will also be etched and this will increase the probability of gate to source/drain leakage.

It the objective of this invention to provide a method of forming a high resistance contact region in either the source region or the drain region of an insulated gate field effect transistor using metal silicide for low resistance contacts which will avoid oxide spacer loss and will use fewer process steps than the conventional method.

This objective is achieved by forming a metal layer over the silicon substrate covering the source region, the drain region, the gate electrode, and the oxide spacers. A photoresist layer is then formed on the metal layer and a contact hole formed in the photoresist layer over the region where the high resistance contact will be formed. That part of the metal layer directly over the region where the high resistance contact will be formed is then bombarded with nitrogen ions from a nitrogen ion beam passing through the contact hole in the photoresist layer and converted to metal nitride.

The substrate and metal layer are then annealed and metal silicide is formed at the gate electrode, the source region, and the drain region except for the region of metal nitride formation since that metal has all been previously converted to metal nitride. The metal nitride and unreacted metal is then etched away leaving a high resistance contact region within either the source region or the drain region, and metal silicide for low resistance contacts to the source region, the drain region, and the gate electrode.

BRIEF DESCRIPTION OF THE DRAWINGS

FIG. 1 shows a cross section view of a silicon integrated circuit substrate after formation of the oxide layer and the photoresist pattern for the formation of the conventional high resistance contact.

FIG. 2 shows a cross section view of a silicon integrated circuit substrate after formation of the oxide pattern over the high resistance contact region and the deposition of the titanium layer for the formation of the conventional high resistance contact.

FIG. 3 shows a cross section view of a silicon integrated circuit substrate after the titanium layer has been annealed for the formation of the conventional high resistance contact.

FIG. 4 shows a cross section view of a silicon integrated circuit substrate after the unreacted titanium and the oxide pattern over the high resistance contact region have been etched away for the formation of the conventional high resistance contact.

DESCRIPTION OF THE PREFERRED EMBODIMENTS

Figure 5:
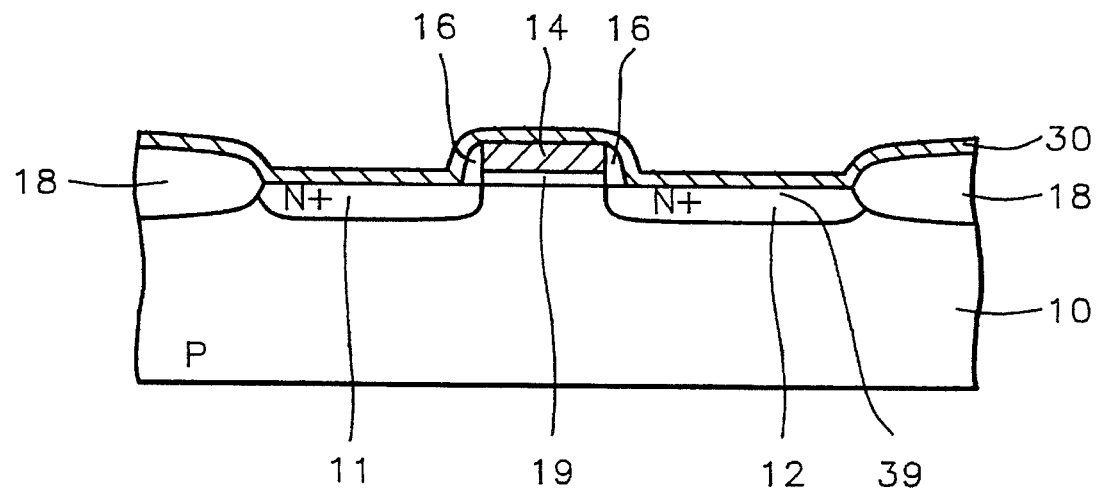
FIG. 5 shows a cross section view of a silicon integrated circuit substrate after formation of a titanium layer for the formation of the high resistance contact of this invention.

Refer now to FIGS. 5–10, there is shown an embodiment for the method of forming a high resistance contact of this invention. FIG. 5 shows a source region 11, a drain region 12, and field oxide regions 18 formed in a silicon integrated circuit substrate 10. There is a high resistance contact region 39 within the drain region 12 where the high resistance contact will be formed. This embodiment shows the high resistance contact region 39 within the drain region 12, however the high resistance contact region 39 could be in the source region 11. The silicon substrate 10 will have a number of such devices only one of which is shown. A gate oxide region 19 and a gate electrode 14 having sidewalls are formed on the silicon substrate 10. Oxide spacers 16 are formed on the sidewalls of the gate electrode 14. A metal layer 30, in this embodiment titanium having a thickness of between about 300 and 600 Angstroms, is formed on the silicon substrate 10 covering the source region 11, the drain region 14, the high resistance contact region 39, the gate electrode 14, the oxide spacers 16, and the field oxide regions 18.

Figure 6:
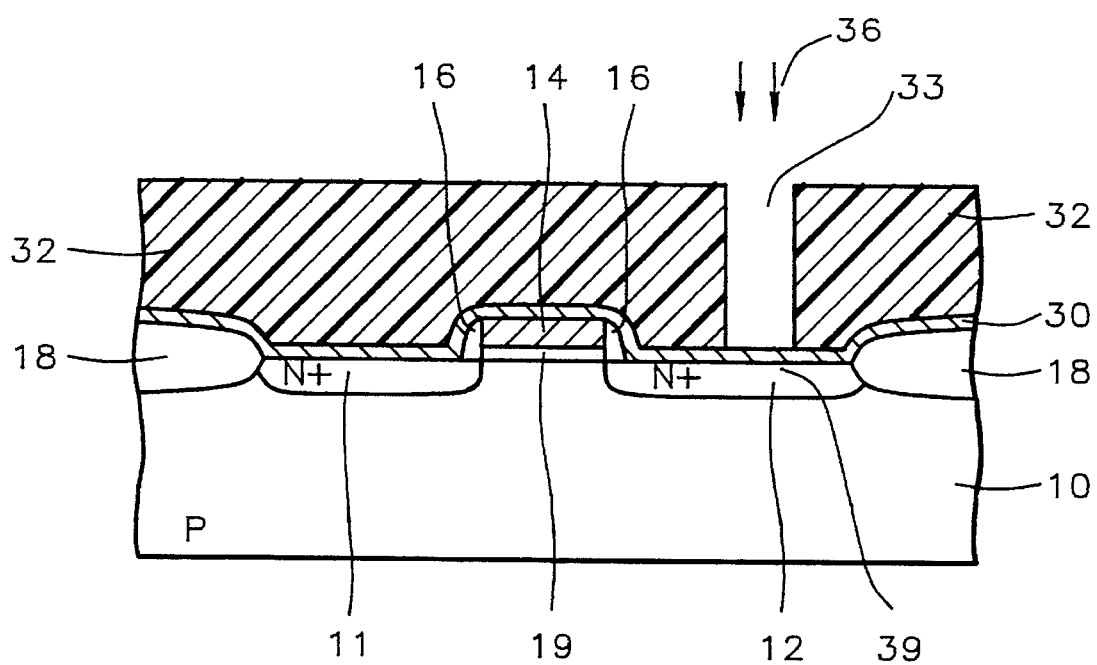
FIG. 6 shows a cross section view of a silicon integrated circuit substrate after formation of a photoresist layer having a contact hole formed over the region where the high resistance contact will be formed and a nitrogen ion beam bombarding the titanium through the contact hole in the photoresist.
Figure 7:
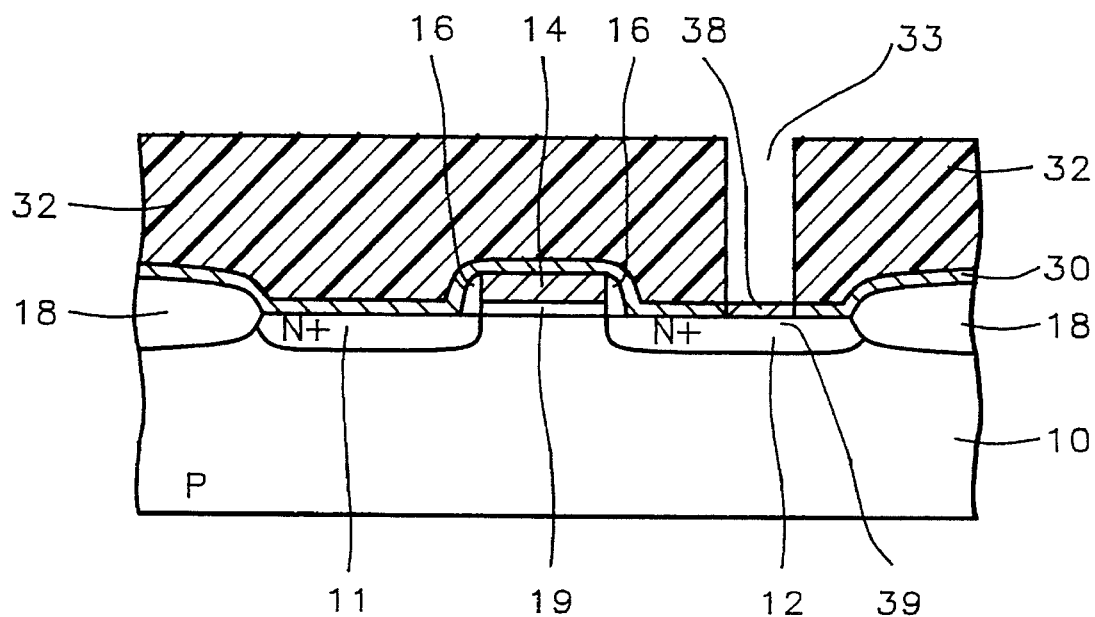
FIG. 7 shows a cross section view of a silicon integrated circuit substrate after the titanium over the region where the high resistance contact will be formed has been converted to titanium nitride.

Next, as shown in FIG. 6, a photoresist layer 32 is formed on the layer of titanium 30. A photoresist contact hole 33 is formed in the photoresist layer 32 directly over the high resistance contact region 39 using photolithographic techniques. The photoresist contact hole 33 exposes that part of the titanium layer 30 directly over the high resistance contact region 39. The silicon substrate 10 is then exposed to a nitrogen ion beam 36 having an energy between about 50 keV and 70 keV and a beam density of between about $5 \times 10^{15}$ and $5 \times 10^{16}$ ions/cm$^2$. Using the photoresist layer 32 as a mask the nitrogen ions pass through the photoresist contact hole 33 and strike that part of the titanium layer which is directly above the high resistance contact region 39. As shown in FIG. 7, the nitrogen ions convert the titanium directly over the high resistance contact region 39 to titanium nitride 38, TiN. The nitrogen ion bombardment is sufficient to convert all the titanium directly over the high resistance contact region to titanium nitride so that no free titanium remains directly over the high resistance contact region.

Figure 8:
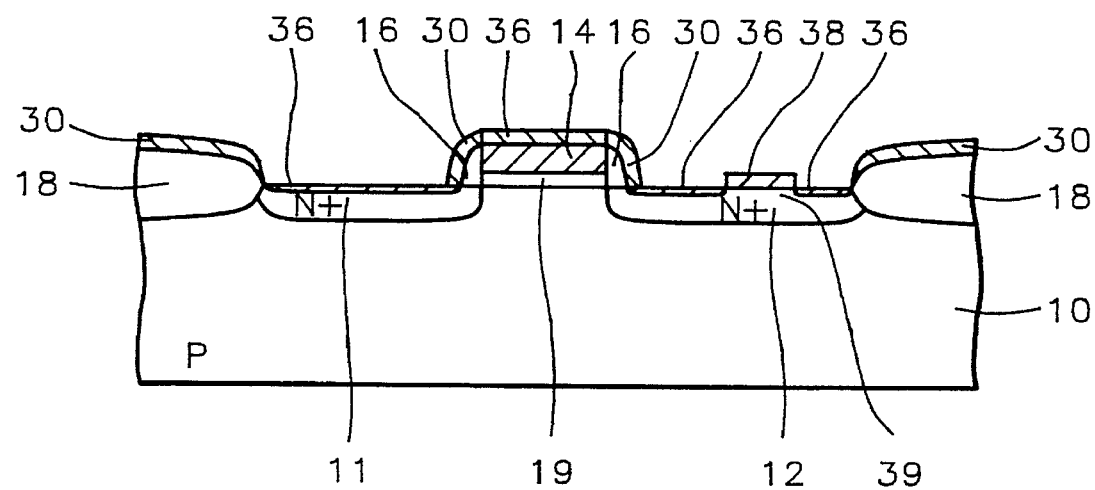
FIG. 8 shows a cross section view of a silicon integrated circuit substrate after the titanium has been annealed.

Next, as shown in FIG. 8, the photoresist layer is removed and the titanium layer and silicon substrate are annealed at a temperature of between about 630° C. and 700° C. for between about 30 and 90 seconds. During the annealing titanium silicide 36 is formed at the locations where there is a titanium silicon interface which is the gate electrode 14, the source region 11, and the drain region 12. No titanium silicide forms over oxide spacers 16 or the field oxide regions 18. Since there is no free titanium in the titanium nitride 38 directly over the high resistance contact region 39, no titanium silicide forms at the high resistance contact region 39.

Figure 9:
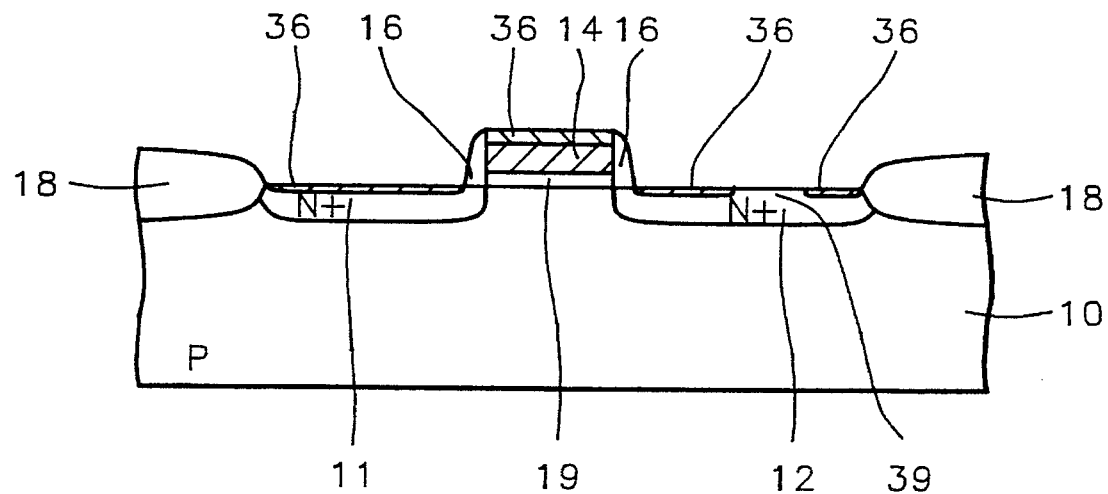
FIG. 9 shows a cross section view of a silicon integrated circuit substrate after the titanium nitride and unreacted titanium have been etched away.

Next, as shown in FIG. 9, the unreacted titanium and the titanium nitride are etched away using Anisotropic Plasma Machining which has a much higher etch rate for titanium and titanium nitride than for titanium silicide. A layer of titanium silicide 36 remains on the gate electrode 14, the source region 11, and the drain region 14 except that part of the drain region making up the high resistance contact region 39. The titanium silicide 36 forms low resistance contacts to the gate electrode 14, the source 11, and the drain 12. The high resistance contact region 39 has no titanium silicide and forms a high resistance contact. The low resistance contacts to the gate electrode 14, source 11, and drain 12 and the high resistance contact to the high resistance contact region 39 are all self aligned.

Figure 10:
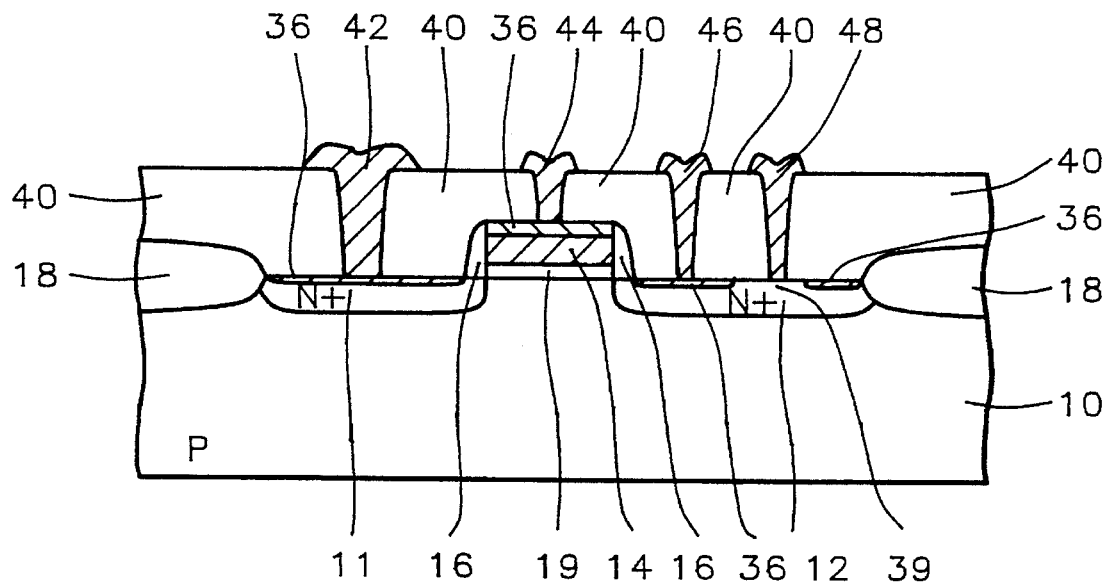
FIG. 10 shows a cross section view of a silicon integrated circuit substrate after the passivation layer and contact holes in the passivation layer have been formed.

Next, as shown in FIG. 10, a passivation layer 40, such as borophosphosilicate glass or the like, is formed on the silicon substrate and contact holes to the gate electrode 14, source 11, drain 12, and high resistance contact region 39 are formed in the passivation layer. The contact holes in the passivation layer are filled with a conductor to form a gate contact 44, a source contact 42, a drain contact 46, and a high resistance contact 48. The high resistance contact 48 contacts the high resistance contact region 39 forming a high resistance resistor to provide electrostatic discharge protection for the device.

This embodiment has described the high resistance resistor formed in the drain region of the field effect transistor. The high resistance resistor could equally well have been formed in the source region of the field effect transistor. FIGS. 5–10 show an N channel field effect transistor. The embodiment works equally well in a P channel field effect transistor.

While the invention has been particularly shown and described with reference to the preferred embodiments thereof, it will be understood by those skilled in the art that various changes in form and details may be made without departing from the spirit and scope of the invention.

What is claimed is:

1. A method of forming a high resistance contact, comprising the steps of:

provided a silicon substrate with a number of devices formed therein wherein each device comprises a source region, a drain region, a high resistance contact region within said drain region, and a channel region;

providing field oxide regions formed in said silicon substrate;

providing gate oxide patterns formed on said silicon substrate over said channel regions;

providing polysilicon gate electrodes having sidewalls formed on said gate oxide patterns;

providing oxide spacers formed on said sidewalls of said polysilicon gate electrodes;

forming a metal layer on said silicon substrate covering said polysilicon gate electrodes, said oxide spacers, said source regions, said drain regions, and said high resistance contact regions;

forming a photoresist layer over said metal layer;

forming contact hole openings in said photoresist layer directly over said high resistance contact regions whereby said contact hole openings expose those regions of said metal layer directly over said high resistance contact regions;

implanting nitrogen ions into those regions of said metal layer directly over said high resistance contact regions by means of a beam of nitrogen ions using said photoresist layer with contact hole openings as a mask, wherein said beam of nitrogen ions changes said metal in those regions of said metal layer directly over said high resistance contact regions to metal nitride;

removing said photoresist layer after implanting said nitrogen ions into those regions of said metal layer directly over said high resistance contact regions;

annealing said silicon substrate and said metal layer, after changing said metal in those regions of said metal layer directly over said high resistance contact regions to metal nitride, thereby forming metal silicide over said polysilicon gate electrodes, said source regions, and said drain regions except said high resistance contact regions;

etching away said metal nitride and those parts of said metal layer not changed to metal silicide, after annealing said silicon substrate and said metal layer;

forming a passivation layer over said silicon substrate after etching away said metal nitride and those parts of said metal layer not changed to metal silicide;

forming contact holes in said passivation layer thereby exposing said high resistance contact regions and parts of said metal silicide formed over said polysilicon gate electrodes, said source regions, and said drain regions; and filling said contact holes in said passivation layer with conducting material.

2. The method of claim 1 wherein said metal layer is titanium having a thickness of between about 300 and 600 Angstroms, said metal nitride is titanium nitride, and said metal silicide is titanium silicide.

3. The method of claim 1 wherein said beam of nitrogen ions has an energy of between about 50 keV and 70 keV and a beam density of between about $5 \times 10^{15}$ and $5 \times 10^{16}$ ions/$cm^2$.

4. The method of claim 1 wherein said annealing of said silicon substrate and metal layer is at a temperature of between about 630° C. and 700° C. for between about 30 and 90 seconds.

5. The method of claim 1 wherein said forming a metal layer on said silicon substrate is accomplished by means of sputtering.

6. The method of claim 1 wherein said etching away said metal nitride and those parts of said metal layer not changed to metal silicide uses Anisotropic Plasma Machining.

7. The method of claim 1 wherein said etching away said metal nitride and those parts of said metal layer not changed to metal silicide does not require a mask.

8. A method of forming a high resistance contact, comprising the steps of:

providing a silicon substrate with a number of devices formed therein wherein each device comprises a source region, a high resistance contact region within said source region, a drain region, and a channel region;

providing field oxide regions formed in said silicon substrate;

providing gate oxide patterns formed on said silicon substrate over said channel regions;

providing polysilicon gate electrodes having sidewalls formed on said gate oxide patterns;

providing oxide spacers formed on said sidewalls of said polysilicon gate electrodes;

forming a metal layer on said silicon substrate covering said polysilicon gate electrodes, said oxide spacers, said source regions, said drain regions, and said high resistance contact regions;

forming a photoresist layer over said metal layer;

forming contact hole openings in said photoresist layer directly over said high resistance contact regions whereby said contact hole openings expose those regions of said metal layer directly over said high resistance contact regions;

implanting nitrogen ions into those regions of said metal layer directly over said high resistance contact regions by means of a beam of nitrogen ions using said photoresist layer with contact hole openings as a mask, wherein said beam of nitrogen ions changes said metal in those regions of said metal layer directly over said high resistance contact regions to metal nitride;

removing said photoresist layer after implanting said nitrogen ions into those regions of said metal layer directly over said high resistance contact regions;

annealing said silicon substrate and said metal layer, after changing said metal in those regions of said metal layer directly over said high resistance contact regions to metal nitride, thereby forming metal silicide over said polysilicon gate electrodes, said drain regions, and said source regions except said high resistance contact regions;

etching away said metal nitride and those parts of said metal layer not changed to metal silicide, after annealing said silicon substrate and said metal layer;

forming a passivation layer over said silicon substrate after etching away said metal nitride and those parts of said metal layer not changed to metal silicide;

forming contact holes in said passivation layer thereby exposing said high resistance contact regions and parts of said metal silicide formed over said polysilicon gate electrodes, said source regions, and said drain regions; and filling said contact holes in said passivation layer with conducting material.

9. The method of claim 8 wherein said metal layer is titanium having a thickness of between about 300 and 600 Angstroms, said metal nitride is titanium nitride, and said metal silicide is titanium silicide.

10. The method of claim 8 wherein said beam of nitrogen ions has an energy of between about 50 keV and 70 keV and a beam density of between about $5 \times 10^{15}$ and $5 \times 10^{16}$ ions/cm$^2$.

11. The method of claim 8 wherein said annealing of said silicon substrate and metal layer is at a temperature of between about 630° C. and 700° C. for between about 30 and 90 seconds.

12. The method of claim 8 wherein said forming a metal layer on said silicon substrate is accomplished by means of sputtering.

13. The method of claim 8 wherein said etching away said metal nitride and those parts of said metal layer not changed to metal silicide uses Anisotropic Plasma Machining.

14. The method of claim 8 wherein said etching away said metal nitride and those parts of said metal layer not changed to metal silicide does not require a mask.

* * * * *